United States Patent
Yoo et al.

(10) Patent No.: US 10,225,938 B2
(45) Date of Patent: Mar. 5, 2019

(54) ULTRA THIN DISPLAY DEVICE

(71) Applicant: LG DISPLAY CO., LTD., Seoul (KR)

(72) Inventors: Dongkwan Yoo, Pyeongtaek-si (KR); Gihyon Jun, Paju-si (KR); Jaehui Yu, Iksan-si (KR); Seoungmo Kang, Paju-si (KR); Homin Lee, Gangneung-si (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 15/442,342

(22) Filed: Feb. 24, 2017

(65) Prior Publication Data
US 2017/0251562 A1    Aug. 31, 2017

(30) Foreign Application Priority Data
Feb. 25, 2016  (KR) .................. 10-2016-0022751

(51) Int. Cl.
G02F 1/1333       (2006.01)
H05K 5/02         (2006.01)
H05K 5/00         (2006.01)
H04N 5/64         (2006.01)

(52) U.S. Cl.
CPC ......... *H05K 5/0217* (2013.01); *G02F 1/1333* (2013.01); *H04N 5/64* (2013.01); *H05K 5/0017* (2013.01); *H05K 5/0247* (2013.01); *G06F 2200/1612* (2013.01)

(58) Field of Classification Search
CPC .. H05K 5/0247; H05K 5/0217; H05K 5/0017; G02F 1/1333; H04N 5/64; H06F 2200/1612
See application file for complete search history.

(56) References Cited

U.S. PATENT DOCUMENTS

| 2006/0077627 | A1* | 4/2006 | Zhang | H04N 5/64 361/679.21 |
|---|---|---|---|---|
| 2006/0240704 | A1* | 10/2006 | Corbett | H04N 5/64 439/502 |
| 2009/0161322 | A1* | 6/2009 | Hughes | H05K 5/0247 361/724 |
| 2014/0092531 | A1* | 4/2014 | Trinh | A47F 7/024 361/679.01 |
| 2014/0195826 | A1* | 7/2014 | Wojcik | H05K 5/0086 713/300 |
| 2016/0070300 | A1* | 3/2016 | Carnevali | G06F 1/181 361/679.41 |

* cited by examiner

*Primary Examiner* — Steven T Sawyer
(74) *Attorney, Agent, or Firm* — Birch, Stewart, Kolasch & Birch, LLP

(57) ABSTRACT

A display device is divided into a panel part and a body part so that the panel part can have an ultra thin thickness. By dividing the display device into the panel part and the body part and connecting them via a connection wiring, it is possible to implement an ultra thin panel part. A first connector is disposed in the panel part, and a second connector is disposed in the connection wiring connected to the body part. The body part can be easily attached to the panel part by connecting the second connector to the first connector, and the body part can be easily detached from the panel part by disconnecting the second connector from the first connector.

17 Claims, 7 Drawing Sheets

ULTRA THIN DISPLAY DEVICE

CROSS-REFERENCE TO RELATED APPLICATIONS

This application claims the priority of Korean Patent Application No. 10-2016-0022751 filed on Feb. 25, 2016, in the Korean Intellectual Property Office, the disclosure of which is hereby incorporated by reference in its entirety.

BACKGROUND

1. Technical Field

The present disclosure relates to a display device, and more specifically, to a display device divided into a panel part and a body part such that the panel part has an ultra thin thickness.

2. Description of the Related Art

As the information-oriented society evolves, various demands for display devices are ever increasing. In accordance with this, flat panel display devices employing a variety of display panels are being developed and released, such as OLED (Organic Light-Emitting Diode), LCD (Liquid-Crystal Display), PDP (Plasma Display Panel), ELD (Electro Luminescent Display), VFD (Vacuum Fluorescent Display), etc.

In addition, recently, display panels and display devices including such display panels are becoming thinner and lighter due to the advancement of the display panel manufacturing process. As the display devices become thinner and lighter, such devices have a great advantage in terms of design as well as technology.

In order to further improve the design quality, efforts have been made to reduce the width of the bezel and to reduce the thickness of display devices.

FIG. 1 is a view of the back side of a typical display module. FIG. 2 is a view of a side of a typical display module.

The display module includes a display panel 10 for displaying an image, and a driving circuit unit 20 for driving the display panel 10.

The driving circuit unit 20 is connected to the display panel 10 via a flexible connection circuit unit 25.

The connection circuit unit 25 may include a flexible printed circuit, a chip on film (COF), or a tape carrier package (TCP).

As shown in FIG. 1, a display module is typically implemented with the driving circuit unit 20 folded back over the back side of the display panel 10.

FIG. 2 shows such a display module when viewed from a side.

The overall thickness of the display module including the driving circuit unit 20 is determined based on the thickness of the display panel itself plus the thickness of the driving circuit unit 20 folded back over the back side of the display panel 10.

FIG. 3 is a view showing the back side of a typical display device. FIG. 4 is a view showing a side of a typical display device.

The display device includes a display panel, as well as a power board 30 for supplying system power for the display device, and a system board 40 for managing a video signal.

A television device capable of receiving broadcast signals and outputting sound signals is implemented by adding capabilities of receiving broadcast signals and outputting sound signals to the system board 40. Such a television device is also a kind of display device and, in the following description, the term display device include a television device.

The overall thickness of a display device is determined based on the arrangement of the driving circuit unit 20, the power board 30 and the system board 40 of the display module, and they are typically disposed in the lower portion of the back side of the display panel 10.

Accordingly, there is a deviation in the thickness of the display device. In order to realize a generally uniformly thin thickness, the driving circuit unit 20, the power board 30, and the system board 40 have to be disposed so that they all have a uniformly thin thickness.

However, since the system board 40 includes various input/output terminals disposed thereon, it has a limitation in reducing its thickness. In addition, the power board 30 includes elements such as a transformer, a rectifier, etc., and thus it also has a limitation in reducing its thickness.

FIG. 5 is a diagram showing a display panel and a driving circuit.

The driving circuit includes a data driver D_D, a gate driver G_D, and a timing controller T_C.

The display panel 10 includes a plurality of data lines DL, a plurality of gate sense lines GL1, and a plurality of gate lines GL2.

The data lines DL are connected to the data driver D_D, and the sense lines GL1 and the gate lines GL2 are connected to the gate driver G_D.

The timing controller T_C controls the driving timings of the data driver D_D and the gate driver G_D.

The data driver D_D and the gate driver G_D of the driving circuit may be connected to the display panel 10 by tape automated bonding (TAB) or chip on glass (COG) technology on a bonding pad of the display panel 10, or may be formed on the display panel 10 in the form of a GIP (Gate In Panel).

Accordingly, the data driver D_D and the gate driver G_D may not significantly affect the overall thickness of the display device.

However, the timing controller T_C is typically implemented on a separate board, and thus the timing controller T_C is a factor for determining the overall thickness of the display module.

In addition, in a display device or a television device, the overall thickness of the device is determined based on the arrangement and the form of the power board and the system board in addition to the timing controller. Since the thickness of the portion where the power board and the system board are disposed is larger than the other portion, it is difficult to realize a uniform thickness of the device.

SUMMARY

It is an object of the present disclosure to provide a display device divided into a panel part and a body part such that the thickness of the panel part is reduced.

It is another object of the present disclosure to provide a display device divided into a panel part and a body part, in which the size of a connector and a connection wiring is reduced to prevent the connector and the connection wiring from harming the appearance.

It is yet another object of the present disclosure to provide a structure that ensures strength and reliability of a connector disposed in a thin panel part.

In accordance with one aspect of the present disclosure, a display device is divided into a panel part and a body part, and the panel part is spaced apart from and connected to the body part via a connection wiring, wherein the panel part has a first connector, and the connection wiring has a second connector such that the panel part is detachable from the body part by the first and second connectors.

In order to ensure the strength and reliability of the first connector, it is preferable that the back cover of the panel part includes a back cover extension, such that the first connector is fixed to the back cover extension.

In accordance with another aspect of the present disclosure, a display device includes a display panel, a panel case housing the display panel, and a connector connected to the display panel. The panel case includes a back cover supporting a back side of the display panel, and a middle cabinet surrounding side surfaces of the display panel, and the connector is disposed on outer side of the middle cabinet.

According to an exemplary embodiment of the present disclosure, a display device has an ultra thin panel part on which images are displayed and has an overall uniform thickness, so that the panel part can be hung on a wall and have a good appearance.

In addition, according to an exemplary embodiment of the present disclosure, the display device has slim connectors and connection wirings that connect the panel part and the body part, such that viewers feel as if the panel part is hung on a wall independently, thereby increasing the commercial value.

According to an exemplary embodiment of the present disclosure, the display device can ensure the strength and reliability of the connector disposed in the thin panel part.

DETAILED DESCRIPTION

Hereinafter, an ultra thin display device according to exemplary embodiments of the present disclosure will be described with reference to the accompanying drawings.

In the following description, the terms first, second, third and the like are used for distinguishing between similar elements and not necessarily for describing a sequential or chronological order. The terms are only used to differentiate one component from other components.

It will be understood that when an element is referred to as being "on" another element, the element may be directly on another element or intervening elements may also be present.

Figure 1:
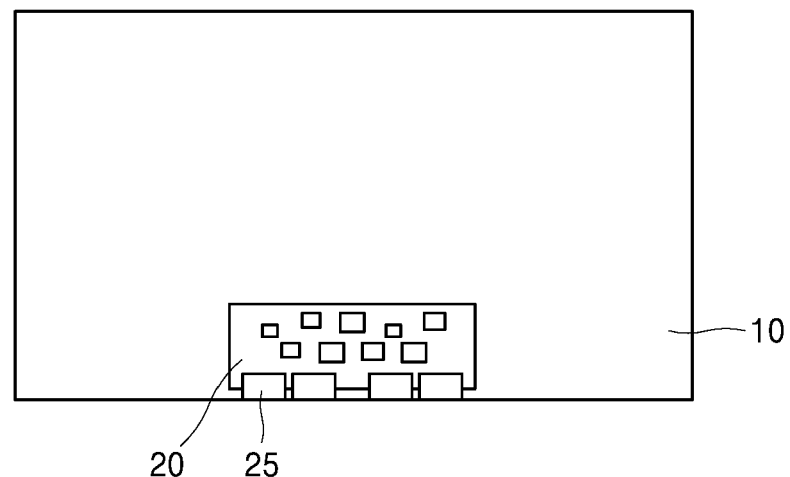
FIG. 1 is a view of the back side of a typical display module.
Figure 2:
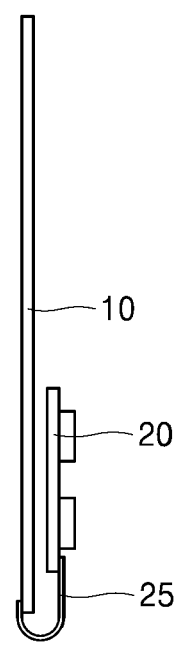
FIG. 2 is a view of a side of a typical display module.
Figure 3:
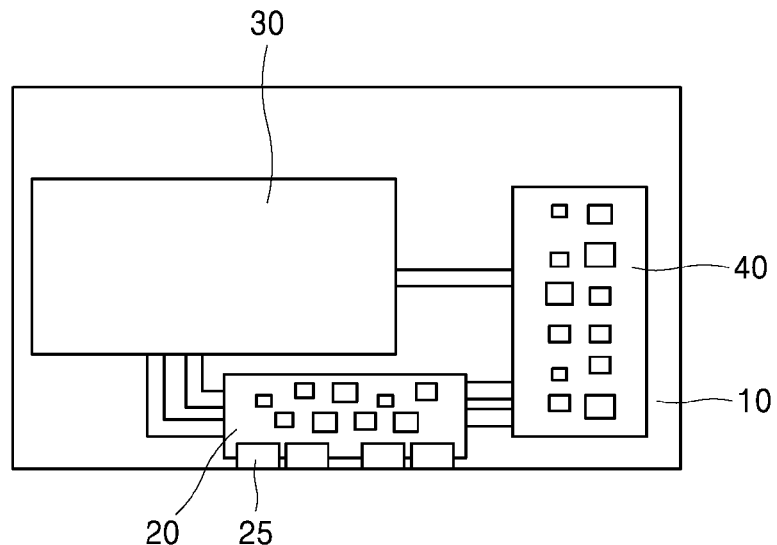
FIG. 3 is a view showing the back side of a typical display device.
Figure 4:
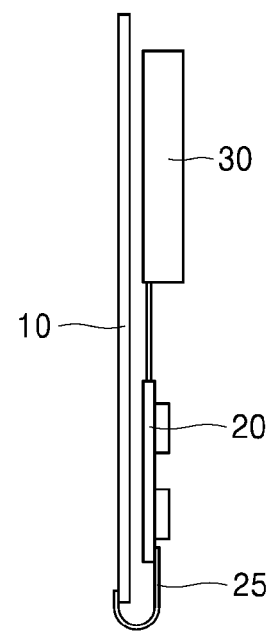
FIG. 4 is a view showing a side of a typical display device.
Figure 5:
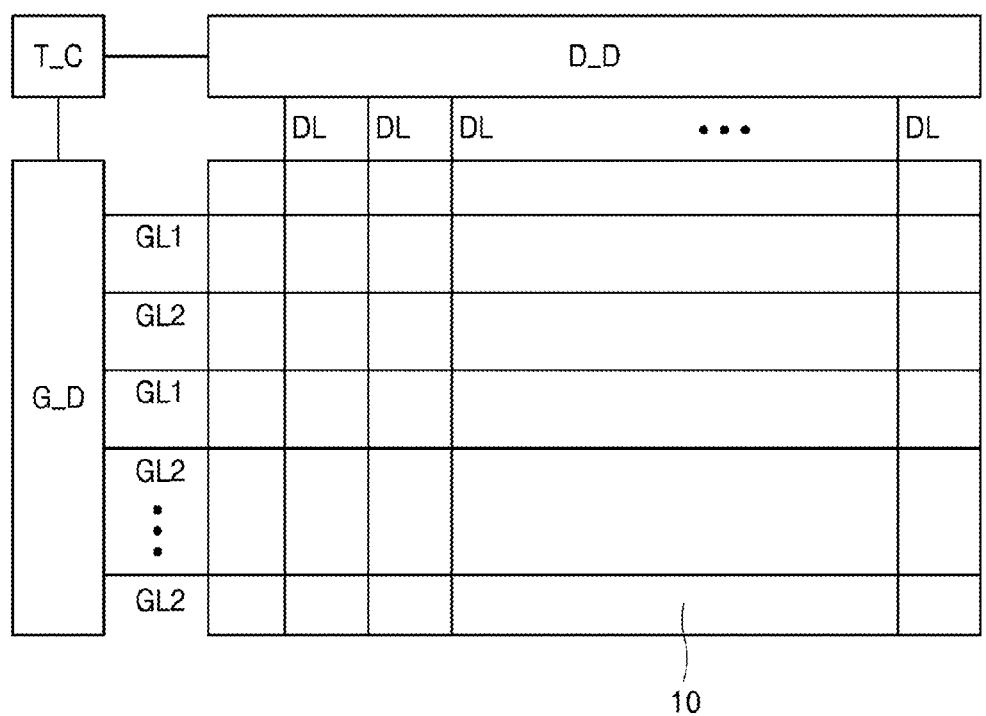
FIG. 5 is a diagram showing a display panel and a driving circuit.
Figure 6:
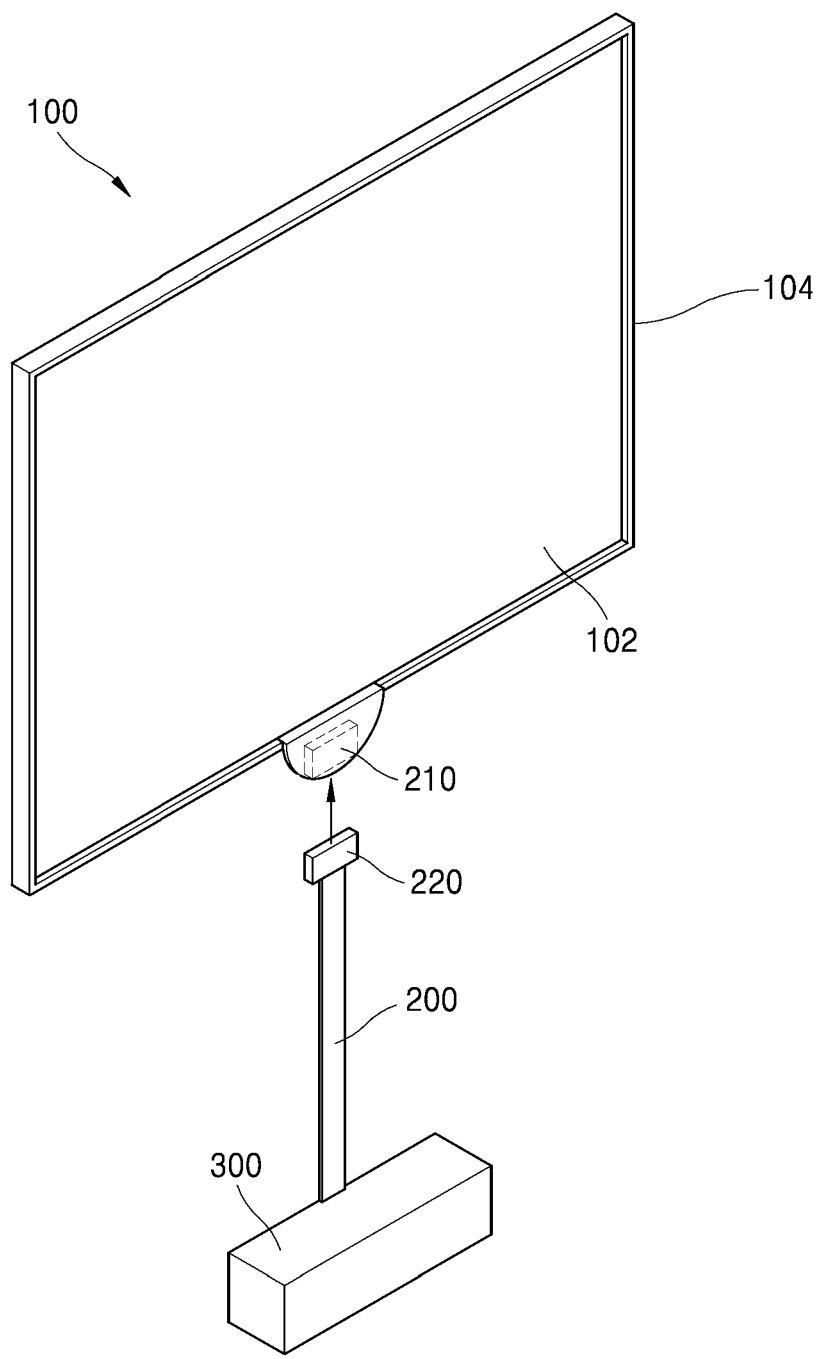
FIG. 6 is a perspective view of a display device according to a first exemplary embodiment of the present disclosure.

FIG. 6 is a perspective view of a display device according to a first exemplary embodiment of the present disclosure.

As shown in the drawings, a display device according to an exemplary embodiment of the present disclosure includes a panel part 100 including a display panel 102 on which an image is displayed, and a body part 300 connected to the panel part 100 via a connection wiring 200.

The panel part 100 and the body part 300 are housed in separate cases and are connected to each other via the connection wiring 200.

A power cable is connected to the body part 300, and input/output terminals for various signals are connected thereto.

The panel part 100 is driven by receiving power and video signals from the body part 300 via the connection wiring 200.

The panel part 100 is housed in a panel case 104. Inside the panel case 104, a display panel 102 and a part of the driving circuit connected to the display panel 102 are included. The panel case 104 may be configured as a separate external case, or a top case of the display panel may serve as the panel case 104.

The gate driver and the data driver of the driving circuit unit may be connected to a bonding pad of the display panel 102 by tape automated bonding (TAB) or chip on glass (COG) technology or may be formed on the display panel 102 in the form of a GIP (Gate In Panel).

Accordingly, the gate driver and the data driver may be housed in the panel case 104 together with the display panel 102.

When the gate driver and the data driver are connected to the bonding pad by the TAB or the COG technology or are implemented in the form of the GIP, the overall thickness of the panel part 100 can be reduced up to several millimeters (mm) even if the gate driver and the data driver are housed in the panel case 104.

The timing controller, on the other hand, has a limitation in reducing its thickness, and thus it is preferable to accommodate the timing controller in the body part 300 rather than in the panel part 100.

By accommodating the timing controller in the body part 300 and employing an OLED panel as the display panel, the thickness of the panel part 100 can be reduced up to 2 to 3 mm.

It is to be understood that the display panel according to the exemplary embodiment of the present disclosure is not limited to the OLED panel. For example, a liquid-crystal display panel including a backlight or a PDP panel may be employed as the display panel.

It is preferable that the connection wiring 200 is hidden so that it is not seen. This is to improve the appearance to thereby increase the commercial value.

To this end, the connection wiring may be made transparent so as not to be seen by human eyes.

The connection wiring may be implemented by disposing electrode wiring on a transparent substrate. A transparent electrode (for example, ITO) may be used as the electrode wiring.

By making the connection wiring transparent, the connection wiring is not seen from the installed product, so that the appearance of the product can be further improved.

Although the body part 300 is disposed below the panel part 100 in the drawings for the purpose of illustration, the part body 300 may be disposed above or beside the panel part 100 depending on the installation location or design choice. In addition, although the panel part 100 is orientated in the horizontal direction in the drawings, the panel part 100 may be orientated in the vertical direction with longer vertical sides.

Incidentally, if the panel part 100 and the body part 300 are coupled together by the connection wiring 200 such that they cannot be separated, it may be inconvenient to handle the product during the manufacturing or distributing process.

Accordingly, according to an exemplary embodiment of the present disclosure, a first connector 210 is disposed on the panel part 100, and a second connector 220 detachably coupled with the first connector 210 is disposed on the connection wiring 200, so that the panel part 100 can be easily attached/detached to/from the connection wiring 200.

Figure 7:
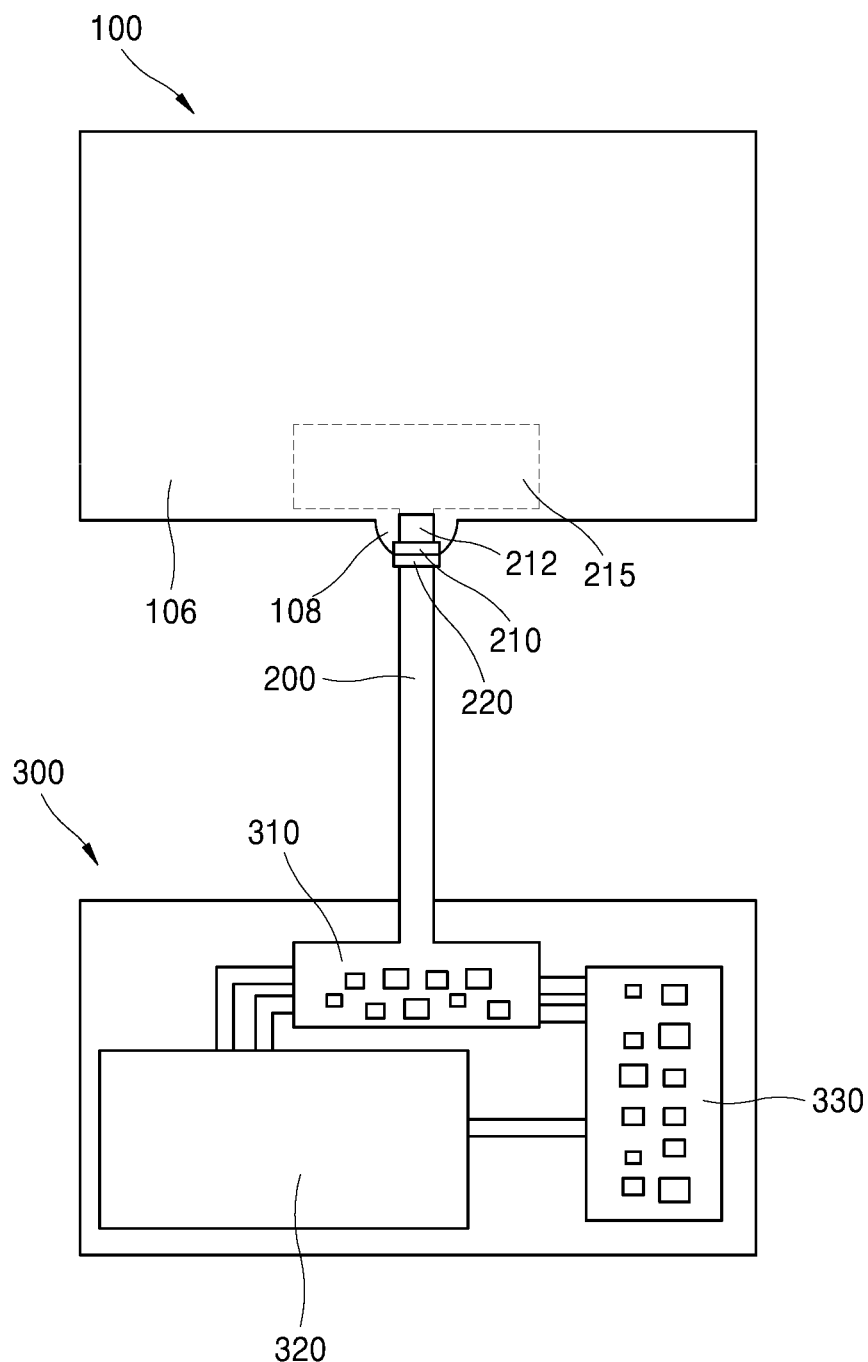
FIG. 7 is a diagram showing a display device according to the first exemplary embodiment of the present disclosure.

FIG. 7 is a diagram showing a display device according to the first exemplary embodiment of the present disclosure.

As shown in FIG. 7, a bridge board 215 is disposed in the panel part 100.

The bridge board 215 connects the driving circuit unit (the gate driver and the data driver) disposed in the panel part 100 with the connection wiring 200.

The bridge board 215 connects the gate driver and the data driver accommodated in the panel part with the connection wiring 200 and may be configured as an FPC. This is because the FPC is more advantageous for implementing a thin display panel than a typical hard printed circuit board. In addition, by stacking the FPCs in multiple layers and stacking the connection wirings 200 in multiple layers, the width of the connection wiring 200 can be reduced.

The connection wiring 200 may be implemented using an FPC (flexible printed circuit) and an FFC (flexible flat cable). By using the FPC or the FFC as the connection wiring 200 instead of a typical cable, the width and thickness of the connection wiring can be reduced, which is advantageous for improving the appearance.

The bridge board 215 disposed in the panel part 100 may be implemented by stacking FPCs for reducing thickness.

If the FPCs are not stacked on one another, a large number of wirings are arranged in a single layer such that the overall width of the connection wiring 200 is increased. As a result, the appearance deteriorates and it is difficult to handle the device. In addition to the increased overall width, several hundreds of wirings arranged in a single layer are likely to be damaged in handling them. Accordingly, it is preferable that the FPCs are stacked on one another in multiple layers to reduce the width of the connection wiring 200 and for easy handling.

The body part 300 includes a power board 320, a system board 330, and a timing controller 310. The power board 320 serves to supply power to the entire display device. The system board 330 includes a terminal for receiving an external signal, etc., and manages system signals of the entire display device. The timing controller 310, as described above, is a part of the driving circuit unit of the display module and is connected to the gate driver and the data driver. All of the power board 320, the system board 330 and the timing controller 310 included in the body part include circuit boards, which may be referred to hereinafter as simply a board.

Typically, the timing controller 310 may be integrally connected to the display module. In contrast, according to the exemplary embodiment of the present disclosure, the timing controller 310 may be spaced apart from the display panel 102, and is connected to the display panel 102 via the connection wiring 200 and the bridge board 215.

By configuring the system board 330 so that it can process capabilities of receiving broadcast signals and outputting sound signals, the display module can become a television device. Accordingly, in the following description, the term display device includes a television device.

The panel part 100 receives power and signals from the body part 300 via the connection wiring 200.

If the timing controller 310 is disposed in the body part 300, a signal applied from the timing controller 310, a data signal, a power signal, etc. has to be applied to the panel part 100 via the connection wiring 200. Thus, the connection wiring 200 may include more than one hundred lines.

It is to be understood that the number of lines of the connection wiring 200 may vary depending on the compression ratio if signals are transmitted by being compressed.

However, even if the panel part 100 and the body part 300 are separated from each other, the appearance of the entire product may be deteriorated if the connection wiring 200 is noticeable.

Therefore, it is preferable to implement the connection wiring 200 as compact and slim as possible.

The panel part 100 is provided with the first connector 210 which is connected to the bridge board 215 via a flexible circuit 212. The second connector 220 connected to the first connector 210 is disposed at the end of the connection wiring 200 that is closer to the panel part 100. The first connector 210 and the second connector 220 allow a consumer to easily connect or disconnect the connection wiring 200 to/from the panel part 100. In addition, this structure allows the panel part 100 and the body part 300 connected to the connection wiring 200 to be independently manufactured during the manufacturing process of the display device, thereby improving the convenience of handling the device in the manufacturing process.

In reducing the overall thickness of the panel part 100 up to several mm, if the thickness of the connectors 210 and 220 is much thicker than the thickness of the panel part 100, the appearance may be deteriorated. Therefore, according to an exemplary embodiment of the present disclosure, there is provided a structure that the thickness of the connectors 210 and 220 can be reduced up to a thickness similar to that of the panel part 100, and that strength and durability that withstand repeated attachment/detachment can be ensured.

The first connector 210 and the second connector 220 may be attached or detached frequently while the display device is moved or used. Accordingly, it is very important to ensure the strength and reliability of the first connector 210 disposed in the thin panel part 100.

In other words, the first connector 210 is required to have a thin thickness and is required to be fixed firmly to the panel part 100.

To this end, according to an exemplary embodiment of the present disclosure, there is provided a structure in which a back cover 106 supporting the back side of the display panel 102 in the panel part 100 is coupled with the first connector 210 to thereby ensure the strength of the first connector 210.

Figure 8:
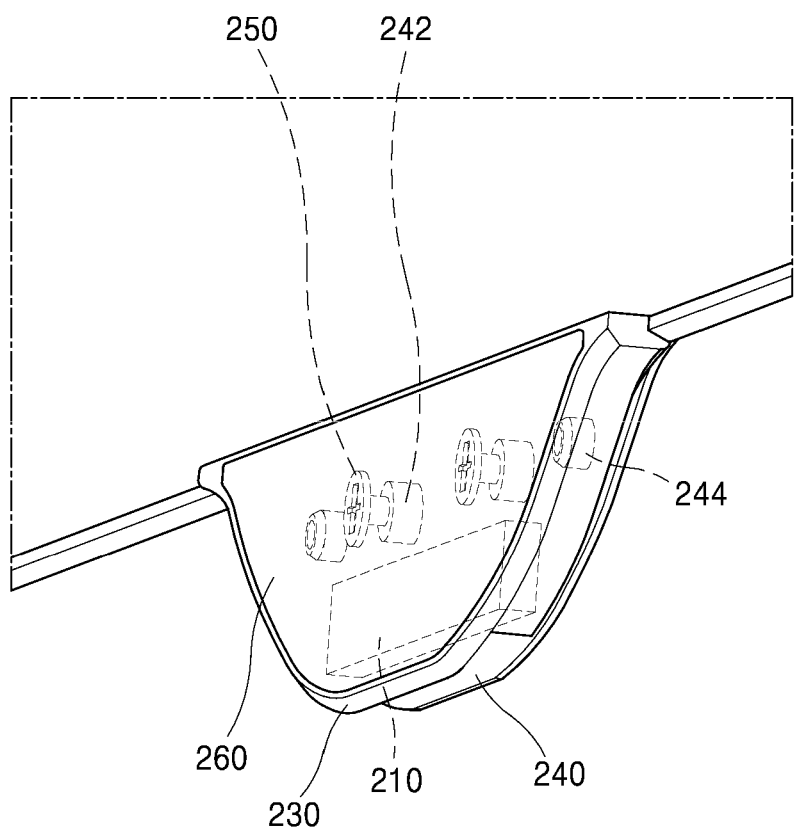
FIG. 8 is an assembled perspective view of the first connector of the display device according to the first exemplary embodiment of the present disclosure.
Figure 9:
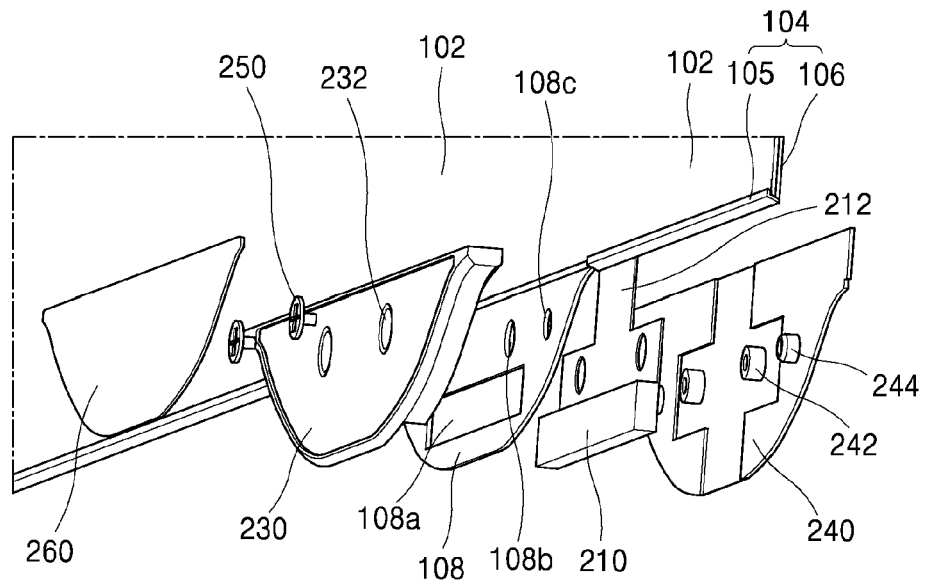
FIG. 9 is an exploded perspective view of the first connector of the display device according to the first exemplary embodiment of the present disclosure.

FIG. 8 is an assembled perspective view of the first connector 210 of the display device according to the first exemplary embodiment of the present disclosure. FIG. 9 is an exploded perspective view of the first connector 210 of the display device according to the first exemplary embodiment of the present disclosure.

The panel part 100 of the display device according to the exemplary embodiment of the present disclosure includes the display panel 102, a panel case 104 for accommodating the display panel 102, and the first connector 210 connected to the display panel 102.

The first connector 210 is preferably disposed on a side of the display panel 102. If the first connector 210 is folded back over the back side of the display panel 102, the thickness of the portion where the first connector 210 is disposed becomes thicker. For this reason, the first connector 210 is disposed on the side of the display panel 102 so that it does not overlap with the display panel 102, thereby reducing the overall thickness.

The panel case 104 includes the back cover 106 for supporting the back side of the display panel 102, and a middle cabinet 105 surrounding the side surfaces of the display panel 102. The back cover 106 is coupled with the display panel 102 such that it overlaps the back side of the display panel 102, to ensure the flatness and strength of the panel part 100.

Since the back cover 106 overlaps with the display panel 102, the thickness of the back cover 106 greatly affects the thickness of the panel part 100. Accordingly, the back cover 106 may be made of a thin metal plate having high strength.

According to an exemplary embodiment of the present disclosure, the back cover 106 includes a back cover extension 108 so that the first connector 210 is firmly fixed to the thin panel part 100.

Preferably, the back cover extension 108 is a part of the back cover 106. If so, it is advantageous in terms of strength and thickness. Preferably, the back cover 106 and the back cover extension 108 may be integrally formed by cutting a single thin metal plate.

If the back cover 106 and the back cover extension 108 are separately cut and are joined by overlapping or welding with each other, the thickness may increase due to the overlapped portion or the welded portion. Further, the strength of the welded portion may be weaker than other portions.

Preferably, the back cover extension 108 has a shape that encloses the first connector 210 in the area where the first connector 210 is disposed. In addition, the back cover extension 108 has a connector insertion hole 108a through which the first connector 210 is inserted.

The first connector 210 is restrained by the connector insertion hole 108a at the time of assembling the back cover extension 108 and the first connector 210, so that the first connector 210 can be more firmly fixed.

In addition, the first connector 210 is connected to the display panel 102 via the flexible circuit 212. The strength of the flexible circuit 212 is relatively weak. In this manner, the first connector 210 is restrained by the back cover extension 108 and thus the first connector 210 is firmly fixed, so that the damage to the flexible circuit 212 due to the movement of the first connector 210 can be prevented.

The first connector 210 is preferably attached to the front surface of the flexible circuit 212. As the flexible circuit 212 is extended out of the back side of the panel part 100 and the first connector 210 is attached to the front surface of the flexible circuit 212, the first connector 210 is inserted into the connector insertion hole 108a from the back side toward the front surface of the back cover extension 108, and the flexible circuit 212 comes in contact with the back surface of the back cover extension 108.

In order to more firmly couple the first connector 210 with the back cover extension 108, a connector front cover 230 and a connector rear cover 240 may be fastened by fastening means with the first connector 210 coupled with the back cover extension 108 therebetween.

The connector front cover 230 and the connector rear cover 240 may be fastened by coupling fastening bolts 250 with fastening bosses 242. The fastening bolts 250 and the fastening bosses 242 may penetrate the back cover extension 108 and the flexible circuit 212.

In other words, by coupling the connector front cover 230 with the connector rear cover 240 such that they press the first connector 210 and the back cover extension 108, the first connector 210 can be restrained by the connector insertion hole 108a of the back cover extension 108 more firmly.

To accurately couple the connector rear cover 240 with the back cover extension 108, the back cover extension 108 may have guide holes 108c, and the connector rear cover 240 may have guide protrusions 244 to be inserted into the guide holes 108c, respectively.

As shown in FIG. 9, by fastening the connector front cover 230 to the connector rear cover 240 by using two fastening bolts 250 and by inserting two guide protrusions 244 into the guide holes 108c, respectively, the connector rear cover 240 is coupled with the back cover extension 108 at four points. Therefore, the connector rear cover 240 can be coupled with the back cover extension 108 more accurately, compared to a structure with only two fastening bolts 250 at two points. Although the guide protrusions 244 are disposed on the connector rear cover 240 in the shown embodiment, the guide protrusions 244 may instead be disposed on the connector front cover 230.

It is also possible to use four fastening bolts 250 to couple the connector rear cover 240 with the back cover extension 108 at four points. However, the number of the fastening bolts 250 increases the number of man-hours needed for assembly.

Accordingly, by determining a tradeoff between the numbers of the fastening bolts 250 and the guide protrusions 244, the connector rear cover 240 can be more accurately coupled with the back cover extension 108 without unnecessarily increasing the number of fastening bolts 250.

An external sticker 260 is attached to the front surface of the connector front cover 230. The external sticker 260 hides the fastening bolts 250 and fastening holes 232, thereby improving the appearance.

Figure 10:
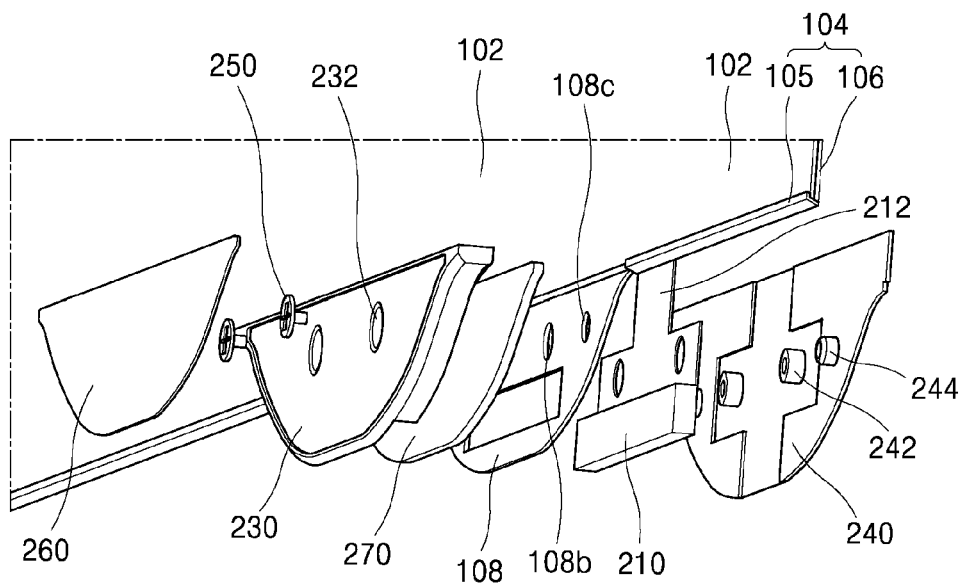
FIG. 10 is an exploded perspective view of a first connector of a display device according to a second exemplary embodiment of the present disclosure.

FIG. 10 is an exploded perspective view of a first connector 210 of a display device according to a second exemplary embodiment of the present disclosure.

The first connector 210 of the display device according to the second embodiment of the present disclosure further includes a moisture-absorbing member 270.

In use, a cleaning liquid may be sprayed on the display area of the display device to clean it by wiping. In doing so, the cleaning liquid may flow under the display area, such that the display device may be damaged.

In the display device according to an exemplary embodiment of the present disclosure, the first connector 210 is disposed on the lower side of the panel part 100, such that the cleaning liquid may flow to the first connector 210.

Since the first connector 210 has a plurality of wirings densely disposed therein, there is a high possibility that a short-circuit or other defect may occur if the cleaning liquid is introduced.

To overcome such an issue, according to this exemplary embodiment, the moisture-absorbing member 270 for absorbing moisture encloses the first connector 210. That is, the cleaning liquid can be absorbed by the moisture-absorbing member 270 even if the cleaning liquid sprayed for cleaning the display area of the display device flows down along the display area of the display panel 102, such that it is possible to prevent damage to the first connector 210.

As shown in FIG. 10, the moisture-absorbing member 270 is preferably disposed between the connector front cover 230 and the back cover extension 108 and pressed therebetween. By disposing the moisture-absorbing member 270 at that location, the moisture-absorbing member 270 covers the front surface of the first connector 210. Accordingly, the cleaning liquid flowing down along the front surface of the display area of the display panel 102 is absorbed by the moisture-absorbing member 270 before reaching the first connector 210, so that damage to the first connector 210 due to the cleaning liquid can be prevented.

Although the exemplary embodiments of the present disclosure have been described for illustrative purposes, those skilled in the art will appreciate that various modifications, additions and substitutions are possible without departing from the scope and spirit of the present disclosure. Accordingly, it will be understood that such modifications, additions and substitutions also fall within the scope of the present disclosure.

What is claimed is:

1. A display device, comprising:
   a display panel having a back side and a plurality of side surfaces;
   a panel case housing the display panel, the panel case including:
      a back cover supporting the back side of the display panel; and
      a middle cabinet surrounding the side surfaces of the display panel;
   a connector connected to the display panel, the connector being disposed on an outer side of the middle cabinet; and
   a connector front cover and a connector rear cover,
   wherein the back cover includes a back cover extension extended toward the connector,
   wherein the back cover extension includes a connector insertion hole through which the connector is inserted, and
   wherein the connector front cover and the connector rear cover are coupled with each other with the back cover extension and the connector located therebetween.

2. The display device of claim 1, further comprising a flexible circuit disposed on the outer side of the middle cabinet, the flexible circuit connecting the connector to the display panel.

3. The display device of claim 1, further comprising a moisture-absorbing member located between the connector front cover and the connector.

4. The display device of claim 1, further comprising a plurality of fasteners connecting the connector front cover and the connector rear cover together, the fasteners penetrating the back cover extension.

5. The display device of claim 4, further comprising:
   a guide hole located in the back cover extension; and
   a guide protrusion located on the connector front cover or the connector rear cover, the guide protrusion being insertable into the guide hole.

6. The display device of claim 1, further comprising:
   a guide hole located in the back cover extension; and
   a guide protrusion located on the connector front cover or the connector rear cover, the guide protrusion being insertable into the guide hole.

7. A display device comprising:
   a panel part including:
      a display panel;
      a panel case housing the display panel; and
      a first connector connected to the display panel;
   a body part spaced apart from the panel case; and
   a connection wiring interconnecting the body part to the panel part, the connection wiring including a second connector attachable to and detachable from the first connector,
   wherein the panel case includes a back cover supporting a back side of the display panel,
   wherein the back cover includes a back cover extension extended toward the first connector, and
   wherein the back cover extension includes a connector insertion hole through which the first connector is inserted.

8. The display device of claim 7, wherein the first connector is located on one side of the display panel.

9. The display device of claim 7, further comprising a flexible circuit connected to the display panel,
   wherein the first connector is located on a front surface of the flexible circuit.

10. The display device of claim 9, further comprising a connector front cover and a connector rear cover,
    wherein the connector front cover and the connector rear cover are coupled with each other with the back cover extension and the first connector located therebetween.

11. The display device of claim 10, further comprising a moisture-absorbing member located between the connector front cover and the first connector.

12. The display device of claim 10, further comprising a plurality of fasteners connecting the connector front cover and the connector rear cover together, the fasteners penetrating the back cover extension.

13. The display device of claim 12, further comprising:
    a guide hole located in the back cover extension; and
    a guide protrusion located on the connector front cover or the connector rear cover, the guide protrusion being insertable into the guide hole.

14. The display device of claim 10, further comprising:
    a guide hole located in the back cover extension; and
    a guide protrusion located on the connector front cover or the connector rear cover, the guide protrusion being insertable into the guide hole.

15. The display device of claim 7, wherein the panel part comprises:
    a driving circuit for driving the display panel;
    a gate driver for applying a gate driving signal to the display panel; and
    a data driver for applying a data signal to the display panel; and
    wherein the body part comprises:
       a timing controller for controlling a timing of the gate driver and the data driver; and
       a power unit for supplying power to the timing controller, the gate driver and the data driver.

16. A display device comprising:
    a panel part including:
       a display panel having a back side and a plurality of side surfaces;
       a panel case housing the display panel, the panel case including:
          a back cover supporting the back side of the display panel; and
          a middle cabinet surrounding the side surfaces of the display panel; and
       a first connector connected to the display panel, the first connector being disposed on an outer side of the middle cabinet;

a body part spaced apart from the panel case;
a connection wiring interconnecting the body part to the panel part, the connection wiring including a second connector attachable to and detachable from the first connector; and
a connector front cover and a connector rear cover,
wherein the back cover includes a back cover extension extended toward the connector,
wherein the back cover extension includes a connector insertion hole through which the first connector is inserted, and
wherein the connector front cover and the connector rear cover are coupled with each other with the back cover extension and the first connector located therebetween.

17. The display device of claim 16, further comprising a flexible circuit connected to the display panel,
wherein the first connector is located on a front surface of the flexible circuit.

\* \* \* \* \*